(12) United States Patent
Michiue

(10) Patent No.: US 10,164,151 B2
(45) Date of Patent: Dec. 25, 2018

(54) NITRIDE SEMICONDUCTOR DEVICE AND METHOD FOR PRODUCING THE SAME

(71) Applicant: NICHIA CORPORATION, Anan-shi, Tokushima (JP)

(72) Inventor: Atsuo Michiue, Anan (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 15/828,267

(22) Filed: Nov. 30, 2017

(65) Prior Publication Data

US 2018/0090642 A1 Mar. 29, 2018

Related U.S. Application Data

(62) Division of application No. 15/339,325, filed on Oct. 31, 2016, now Pat. No. 9,865,774, which is a division
(Continued)

(30) Foreign Application Priority Data

Nov. 18, 2014 (JP) ................................. 2014-233922

(51) Int. Cl.
*H01L 21/00* (2006.01)
*H01L 33/18* (2010.01)
(Continued)

(52) U.S. Cl.
CPC .......... *H01L 33/18* (2013.01); *H01L 21/0242* (2013.01); *H01L 21/0243* (2013.01);
(Continued)

(58) Field of Classification Search
CPC ... H01L 21/0254; H01L 33/32; H01L 33/007; H01L 21/02458; H01L 21/02433; H01L 33/0075; H01L 21/02516
See application file for complete search history.

(56) References Cited

U.S. PATENT DOCUMENTS 7,683,386 B2 * 3/2010 Tanaka ................ H01L 21/0237
257/88
8,211,727 B2 7/2012 Hanawa et al.
(Continued)

FOREIGN PATENT DOCUMENTS

JP 2003-060233 2/2003
JP 2003-197963 A 7/2003
(Continued)

OTHER PUBLICATIONS

Notice of Allowance issued in U.S. Appl. No. 14/944,049 dated Aug. 26, 2016.
(Continued)

*Primary Examiner* — Ngan Ngo
(74) *Attorney, Agent, or Firm* — Foley & Lardner LLP

(57) ABSTRACT

A method for producing a nitride semiconductor device. The method comprises providing a substrate made of a material other than a nitride semiconductor. The material has a hexagonal crystal structure. An upper face of the substrate has at least one flat section. The method further comprises growing a first nitride semiconductor layer on the upper face of the substrate. The first nitride semiconductor layer is made of monocrystalline AlN. The first nitride semiconductor layer has an upper face that is a +c plane. The first nitride semiconductor layer has a thickness in a range of 10 nm to 100 nm. The method further comprises growing a second nitride semiconductor layer on the upper face of the first nitride semiconductor layer. The second nitride semiconductor layer is made of $In_XAl_YGa_{1-X-Y}N$ (0≤X, 0≤Y, X+Y<1). In an initial stage of growing the second nitride semiconductor layer, micronuclei are formed in multiple locations on the upper face of the first nitride semiconductor layer such that a plurality of upside-down hexagonal pyramid-shaped or upside-down hexagonal frustum-shaped recesses separate the micronuclei above the at least one flat
(Continued)

section of the upper face of the substrate. After the initial stage of growing, further growth is performed to reduce a size of the recesses until the recesses are substantially eliminated. The further growth is performed such that the recesses are substantially eliminated before a thickness of the second nitride semiconductor layer grows to 800 nm. The second nitride semiconductor layer is grown to have an upper face with at least one flat section.

3 Claims, 11 Drawing Sheets

Related U.S. Application Data of application No. 14/944,049, filed on Nov. 17, 2015, now Pat. No. 9,515,219.

(51) Int. Cl.
    *H01L 33/00* (2010.01)
    *H01L 33/12* (2010.01)
    *H01L 33/32* (2010.01)
    *H01L 21/02* (2006.01)
    *H01L 33/20* (2010.01)
    *H01L 33/24* (2010.01)
    *H01L 33/16* (2010.01)

(52) U.S. Cl.
    CPC ...... *H01L 21/0254* (2013.01); *H01L 21/0262* (2013.01); *H01L 21/02433* (2013.01); *H01L 21/02458* (2013.01); *H01L 21/02505* (2013.01); *H01L 21/02516* (2013.01); *H01L 21/02609* (2013.01); *H01L 21/02639* (2013.01); *H01L 21/02647* (2013.01); *H01L 33/007* (2013.01); *H01L 33/0075* (2013.01); *H01L 33/12* (2013.01); *H01L 33/20* (2013.01); *H01L 33/24* (2013.01); *H01L 33/32* (2013.01); *H01L 33/16* (2013.01)

(56) References Cited

U.S. PATENT DOCUMENTS

| 8,471,266 | B2 | 6/2013 | Hanawa et al. |
| 8,829,544 | B2 | 9/2014 | Hikosaka et al. |
| 8,957,433 | B2* | 2/2015 | Sako ............... C30B 25/186 257/95 |
| 8,963,165 | B2 | 2/2015 | Araki et al. |
| 9,287,451 | B2* | 3/2016 | Chiu ............... H01L 33/007 |
| 9,412,580 | B2 | 8/2016 | Arena et al. |
| 9,515,219 | B2* | 12/2016 | Michiue ............ H01L 33/0075 |
| 2003/0057444 | A1* | 3/2003 | Niki ............... H01L 33/007 257/200 |
| 2004/0232440 | A1 | 11/2004 | Ohtsuka et al. |
| 2005/0179130 | A1 | 8/2005 | Tanaka et al. |
| 2006/0046325 | A1 | 3/2006 | Usui et al. |
| 2006/0138431 | A1 | 6/2006 | Dwilinski et al. |
| 2007/0120141 | A1 | 5/2007 | Moustakas et al. |
| 2008/0303042 | A1* | 12/2008 | Minato ............ H01L 33/10 257/98 |
| 2009/0166608 | A1 | 7/2009 | Nakanishi et al. |
| 2010/0025684 | A1 | 2/2010 | Shinohara et al. |
| 2010/0195687 | A1 | 8/2010 | Okamoto et al. |
| 2010/0219445 | A1 | 9/2010 | Yokoyama et al. |
| 2011/0127544 | A1 | 6/2011 | Paskova et al. |
| 2011/0140127 | A1 | 6/2011 | Son et al. |
| 2011/0316041 | A1* | 12/2011 | Narita ............... C30B 25/183 257/103 |
| 2012/0009768 | A1* | 1/2012 | Tadatomo ............ C30B 25/18 438/479 |
| 2012/0018764 | A1 | 1/2012 | Choi et al. |
| 2012/0126293 | A1 | 5/2012 | Sumiya et al. |
| 2012/0189029 | A1 | 7/2012 | Kashiwagi et al. |
| 2012/0223329 | A1 | 9/2012 | Kinoshita et al. |
| 2012/0298952 | A1* | 11/2012 | Hikosaka ............ H01L 33/20 257/13 |
| 2012/0299014 | A1* | 11/2012 | Hikosaka ............ H01L 33/12 257/77 |
| 2013/0001644 | A1 | 1/2013 | Fujikura et al. |
| 2014/0061661 | A1* | 3/2014 | Sako ............... C30B 25/186 257/76 |
| 2014/0225154 | A1 | 8/2014 | Daigo |
| 2014/0312369 | A1 | 10/2014 | Yoon et al. |
| 2015/0125980 | A1 | 5/2015 | Kurihara et al. |
| 2015/0171263 | A1* | 6/2015 | Nakatsu ............ H01L 33/007 257/13 |
| 2015/0214308 | A1 | 7/2015 | Fujikura et al. |
| 2015/0236200 | A1* | 8/2015 | Hikosaka ............ H01L 33/20 428/141 |
| 2015/0311388 | A1* | 10/2015 | Shimooka ........... H01L 33/007 257/615 |
| 2015/0349197 | A1* | 12/2015 | Watanabe ........... H01L 33/025 257/13 |
| 2015/0349202 | A1* | 12/2015 | Yamamoto ........... H01L 33/02 257/98 |
| 2015/0372190 | A1 | 12/2015 | Hirayama |
| 2016/0043274 | A1* | 2/2016 | Kanto ............... H01L 33/46 257/98 |
| 2016/0149079 | A1* | 5/2016 | Koike ............... H01L 33/007 257/79 |
| 2016/0233375 | A1 | 8/2016 | Northrup et al. |
| 2016/0359083 | A1* | 12/2016 | Hao ............... H01L 33/12 |
| 2017/0125632 | A1* | 5/2017 | Watabe ............ H01L 33/06 |
| 2017/0133548 | A1* | 5/2017 | Kitano ............ H01L 33/0075 |
| 2017/0256677 | A1* | 9/2017 | Fujikura ........... C23C 16/34 |
| 2017/0263807 | A1* | 9/2017 | Fujikura ........... C23C 16/34 |
| 2018/0047871 | A1* | 2/2018 | Jung ............... H01L 33/12 |

FOREIGN PATENT DOCUMENTS

| JP | 2004-349387 A | 12/2004 |
| JP | 2006-080378 A | 3/2006 |
| JP | 2009-081406 A | 4/2009 |
| JP | 2009-123717 A | 6/2009 |
| JP | 2010-040867 A | 2/2010 |
| JP | 2012-244092 A | 12/2012 |
| JP | 2013-014450 A | 1/2013 |
| JP | 2013-065849 A | 4/2013 |
| JP | 2013-214686 A | 10/2013 |
| WO | WO-2011/058968 A1 | 5/2011 |
| WO | WO-2012/090818 A1 | 7/2012 |
| WO | WO-2013/061572 A1 | 5/2013 |

OTHER PUBLICATIONS

Notice of Allowance issued in U.S. Appl. No. 15/339,325 dated Sep. 1, 2017.

* cited by examiner

POSITIONAL RELATIONSHIP     ELECTRON DIFFRACTION PATTERN

NITRIDE SEMICONDUCTOR DEVICE AND METHOD FOR PRODUCING THE SAME

CROSS-REFERENCE TO RELATED APPLICATIONS

This application is a divisional of U.S. patent application Ser. No. 15/339,325, filed on Oct. 31, 2016, which is a divisional of U.S. patent application Ser. No. 14/944,049, filed on Nov. 17, 2015, which claims priority to Japanese Patent Application No. 2014-233922, filed on Nov. 18, 2014, the entireties of which are hereby incorporated herein by reference.

BACKGROUND

1. Field of the Invention

The present disclosure relates to a nitride semiconductor device and a method for producing the same.

2. Description of Related Art

A conventional process for producing nitride semiconductor devices involves forming a buffer layer made of a nitride, such as AlN, which moderates lattice constant mismatch, on a sapphire substrate or the like, and further stacking a gallium nitride-based semiconductor by metalorganic chemical vapor deposition. Japanese Patent Application Publication No. 2006-080378 and Japanese Patent Application Publication No. 2013-065849, for example, each discloses a process for stacking, as buffer layers, a first buffer layer made of high carbon concentration AlN and a second buffer layer made of low carbon concentration AlN, and further stacking a defect-reducing layer made of undoped GaN for reducing crystal defects by metalorganic chemical vapor deposition. Japanese Patent Application Publication No. 2009-081406 discloses a process for forming a buffer layer made of AlN on a sapphire substrate by sputtering, and further stacking an undoped GaN layer as an underlayer by metalorganic chemical vapor deposition.

SUMMARY

The production process disclosed in Japanese Patent Application Publication No. 2006-080378 or Japanese Patent Application Publication No. 2013-065849, however, requires the second buffer layer to have a thickness of about 1-4 μm, while the first buffer layer is about 5-20 nm in thickness, and also requires about 1.5-5 μm of the GaN layer stacked on the buffer layers before its upper face becomes flat.

The production process disclosed in Japanese Patent Application Publication No. 2009-081406, moreover, requires the GaN layer, the underlayer, to have a thickness of about 2 μm, while the AlN buffer layer is about 40 nm in thickness.

In other words, in the conventional production processes, the semiconductor stack, buffer layer and underlayer combined, needs to have a considerably large thickness, requiring a long time to form these layers. One object of the present disclosure is to provide a nitride semiconductor device that can be produced in a simplified manner and has reduced crystal defects in the nitride semiconductor layers, and provide a method for producing the same.

A method according to the present disclosure is a method for producing a nitride semiconductor device. The method comprises providing a substrate made of a material other than a nitride semiconductor. The material has a hexagonal crystal structure. An upper face of the substrate has at least one flat section. The method further comprises growing a first nitride semiconductor layer on the upper face of the substrate. The first nitride semiconductor layer is made of monocrystalline AlN. The first nitride semiconductor layer has an upper face that is a +c plane. The first nitride semiconductor layer has a thickness in a range of 10 nm to 100 nm. The method further comprises growing a second nitride semiconductor layer on the upper face of the first nitride semiconductor layer. The second nitride semiconductor layer is made of $In_XAl_YGa_{1-X-Y}N$ ($0 \le X$, $0 \le Y$, $X+Y<1$). In an initial stage of growing the second nitride semiconductor layer, micronuclei are formed in multiple locations on the upper face of the first nitride semiconductor layer such that a plurality of upside-down hexagonal pyramid-shaped or upside-down hexagonal frustum-shaped recesses separate the micronuclei above the at least one flat section of the upper face of the substrate. After the initial stage of growing, further growth is performed to reduce a size of the recesses until the recesses are substantially eliminated. The further growth is performed such that the recesses are substantially eliminated before a thickness of the second nitride semiconductor layer grows to 800 nm. The second nitride semiconductor layer is grown to have an upper face with at least one flat section.

The nitride semiconductor device according to the present disclosure comprises a substrate made of a material other than a nitride semiconductor, having a hexagonal crystal structure, and having at least one flat section of an upper face of the substrate, a first nitride semiconductor layer made of monocrystalline AlN grown on the substrate, and a second nitride semiconductor layer made of $In_XAl_YGa_{1-X-Y}N$ ($0 \le X$, $0 \le Y$, $X+Y<1$) grown on an upper face of the first nitride semiconductor layer. The first nitride semiconductor layer has a thickness in a range of 10 nm to 100 nm. The upper face of the first nitride semiconductor layer is a +c plane. A plurality of crystal defects extend upwardly in the second nitride semiconductor layer from the first nitride semiconductor layer above the at least one flat section of the upper face of the substrate and terminate at a height of 800 nm or lower as measured from the upper face of the first nitride semiconductor layer above the at least one flat section of the upper face of the substrate. The second nitride semiconductor layer has a higher crystal defect density in a region of the second nitride semiconductor layer up to and including a height of 800 nm as measured from the upper face of the first nitride semiconductor layer than it does in a region of the second nitride semiconductor layer higher than 800 nm as measured from the upper face of the first nitride semiconductor layer above the at least one flat section of the upper face of the substrate.

The method for producing a nitride semiconductor device according to the present disclosure can produce a nitride semiconductor device with reduced crystal defects in the nitride semiconductor layers in a simplified manner.

The nitride semiconductor device according to the present disclosure can be of high quality with reduced crystal defects in the nitride semiconductor layers.

DETAILED DESCRIPTION OF EMBODIMENTS

Figure 1:
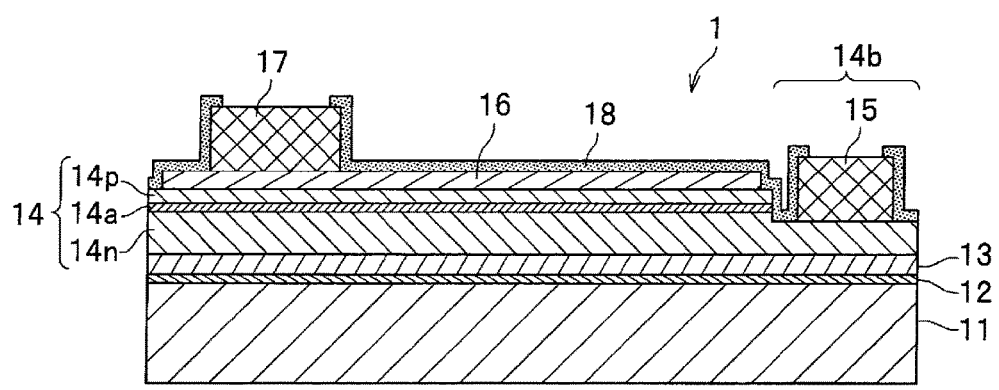
FIG. 1 is a schematic cross-sectional view illustrating the configuration of the nitride semiconductor device according to one embodiment.

Various embodiments of the present invention will be explained below, with some references to accompanying drawings.

The drawings referenced in the explanation below are schematic representations of some embodiments of the present invention. As such, the objects might not be drawn to scale, their spacing and relative positions may be exaggerated, or a part of an object might be omitted. Moreover, scaling or spacing of the objects might not match between the plan and sectional views. In the explanation below, moreover, those having the same designations and reference numerals are of the same member or the same material as a rule, for which detailed explanations are omitted as deemed appropriate.

Configuration of Nitride Semiconductor Device

Figure 2A:
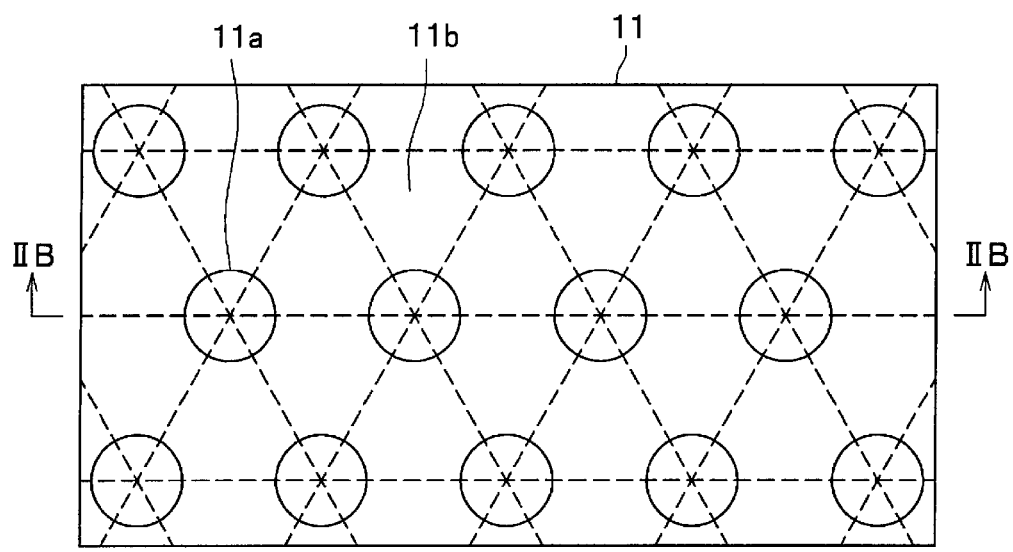
FIG. 2A is a schematic plan view enlarging one portion of the substrate of the nitride semiconductor device according to one embodiment.
Figure 2B:
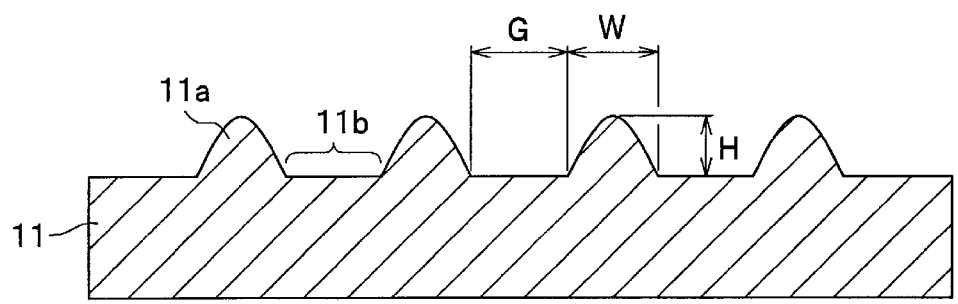
FIG. 2B is a schematic cross-sectional view along line IIB-IIB indicated in FIG. 2A.

The configuration of a nitride semiconductor device according to one embodiment will be explained with reference to FIGS. 1, 2A and 2B. FIG. 1 is a schematic cross-sectional view illustrating a configuration of a nitride semiconductor device according to one embodiment. FIG. 2A is a schematic plan view enlarging a portion of a substrate in a nitride semiconductor device according to the embodiment. FIG. 2B is a schematic cross-sectional view along line IIB-IIB indicated in FIG. 2A.

A nitride semiconductor device 1 according to this embodiment has a substrate 11 which supports, and allows for the crystal growth of, nitride semiconductors; a first nitride semiconductor layer 12 stacked on the substrate 11; a second nitride semiconductor layer 13 stacked on the first nitride semiconductor layer 12; and a light emitting device structure 14 stacked on the second nitride semiconductor layer 13. Moreover, the light emitting device structure 14 has at least an n-type semiconductor layer 14$n$ and a p-type semiconductor layer 14$p$ in that order starting from the substrate 11 side, and preferably has an active layer 14$a$ between them. The light emitting device structure 14 has a stepped section 14$b$ where at least the p-type semiconductor layer 14p and the active layer 14a are removed in one region, and its bottom face is the n-type semiconductor layer 14n. An n-side electrode 15 is provided on the upper face of the n-type semiconductor layer 14n, which is the bottom face of the stepped section 14b, while a full surface electrode 16 is provided across substantially the entire upper face of the p-type semiconductor layer 14p, and a p-side electrode 17 is provided in one section of the upper face of the full surface electrode 16. Moreover, the upper face of the nitride semiconductor device 1 is covered by an insulator 18 so as to have an opening in one portion of each of the upper faces of the n-side electrode 15 and the p-side electrode 17.

In this embodiment, the light emitting device structure 14 is a semiconductor stack having an LED structure. The light emitting device structure 14 is configured so that the active layer 14a emits light when supplied with power by connecting the n-side electrode 15 and p-side electrode 17 to an external power supply. In this embodiment, the nitride semiconductor device 1 equipped with a light emitting device structure 14 will be described, by way of example, as having an LED structure, but the light emitting device structure 14 may have an LD (laser diode) structure. The nitride semiconductor device 1, furthermore, can also be applied to a semiconductor device structured for another function in place of the light emitting device structure 14, such as, for example, a field-effect transistor, or the like.

The substrate 11 supports the nitride semiconductor layers comprising the first nitride semiconductor layer 12, the second nitride semiconductor layer 13, and the light emitting device structure 14, and is for allowing the crystals of these nitride semiconductor layers to grow. For the substrate 11, any materials suitable for allowing nitride semiconductor crystals to grow on its upper face can be used. Given that the nitride semiconductor described later in this embodiment has a hexagonal crystal structure, a material having a hexagonal crystal structure is also used for the substrate 11. Such substrate materials include sapphire and SiC, and sapphire which transmits light can be more suitably used. It is preferable to have a crystallographic +c plane as the principal plane of the substrate 11 (in the case of sapphire, Al-polar surface) on which crystal growth of nitride semiconductors are allowed to proceed. Making the principle plane of the substrate 11 sapphire Al-polar face is believed to readily make the upper face of the first nitride semiconductor layer 12 uniformly AlN Al-polar face.

The substrate 11, moreover, has a plurality of protrusions 11a formed on the principal plane (upper face) where the first nitride semiconductor layer 12 is to be stacked. The region where there are no protrusions 11a formed on the principal plane of the substrate 11 is a flat section 11b, which has a flat surface. Forming a plurality of protrusions 11a on the principal plane of the substrate 11 can reduce dislocations that penetrate to the upper face of the second nitride semiconductor layer 13 during the crystal growth.

In cases where the nitride semiconductor device 1 is equipped with a light emitting device structure 14 having an LED structure, moreover, providing protrusions 11a allows the laterally propagating light within the nitride semiconductor stack to be reflected against the protrusions 11a to propagate vertically. This can increase the frontal luminance, and/or increase the light extraction efficiency of the nitride semiconductor device 1. A substrate 11 having an entirely flat principal plane may be used.

The protrusions 11a can be columnar, conical/pyramidal, frustum, or hemispherical, or the like, in shape. The bottom faces thereof can be circular, elliptical, oval, regular polygonal, or rectangular, or the like, in shape. Given that GaN, or the like, that forms the second nitride semiconductor layer 13 has a crystal structure with six-fold symmetry, the protrusions 11a preferably have a bottom face that is a regular hexagon which is six-fold symmetric. A circular shape, which can be easily formed, may also be used. The protrusions 11a, moreover, preferably have no crystallographic c planes so they can suppress crystal growth from the surfaces thereof. For this purpose, protrusions 11a are preferably conical/pyramidal in shape with tilted side faces and pointed tops. The apex of each protrusion 11a may be rounded.

The protrusions 11a have the same shape, and formed in an array. The protrusions 11a, moreover, are regularly arranged to have the same distance between the centers of adjacent protrusions 11a in a plan view. They are, for example, arranged so that their centers are positioned at the vertices of equilateral triangles indicated by broken lines in FIG. 2A. The equilateral triangular lattice arrangement of the protrusions 11a is one example, and the arrangement may assume any other polygonal lattices, such as a rectangular or hexagonal lattice.

The spacing G between the protrusions 11a is preferably in the range of, for example, 0.2 μm to 5 μm. The protrusions 11a, moreover, preferably have a width W in the range of, for example, 0.2 μm to 5 μm, and a height H in the range of, for example, 0.2 μm to 2 μm. The number of protrusions 11a is determined in consideration of the aforementioned spacing G and width W depending on the area of the principal plane of the substrate 11. For example, the protrusions 11a are uniformly arranged across the entire upper face of the substrate 11.

The first nitride semiconductor layer 12 is a thin film buffer layer made of monocrystalline AlN. The first nitride semiconductor layer 12 is in direct contact with the surface of the substrate 11, and is formed by, for example, metalorganic chemical vapor deposition (MOCVD). Whether or not the first nitride semiconductor layer 12 is monocrystalline can be verified by observing the electron diffraction pattern using a transmission electron microscope (TEM). If the observed object is monocrystalline, a diffraction pattern of a two-dimensional spot array forming a net pattern (i.e., lattice patterned spots) is observed. If the object observed is polycrystalline, Debye-Scherrer (diffraction) rings are observed, and if amorphous, a halo (blurred ring) is observed.

The degree of crystallinity can be assessed based on the quantity of crystal defects (such as dislocations), and the crystal orientation. Fewer crystal defects, such as dislocations, indicates better crystallinity. A higher degree of orientation indicates better crystallinity. Here, crystal defects can be assessed by observing a cathode luminescence (CL) image obtained by the CL imaging technique. For example, the light emitted by the nitride semiconductor crystal of the emission wavelength attained by electron beam irradiation can be observed by a CL image which visualizes the intensity of the light of that emission wavelength. Crystal defects absorb light, and thus, the dark spots in the CL image can be detected as crystal defects. CL imaging will be described later. Crystal defects, such as dislocations, can also be observed by using a transmission electron microscope (TEM). The sample to be observed by a TEM image, however, needs to be made into an very thin film, such as 0.1 μm in thickness, for example, and the observable range is narrower than that for a CL image. In cases where a sample has a small number of crystal defects, it might be difficult to observe an adequate number of crystal defects using a TEM image. Accordingly, in the example discussed later, a CL image was used which enabled the observation of a larger number of crystal defects.

The degree of crystal orientation can be assessed based on the full width at half maximum (FWHM) of the spectra obtained by XRC (X-ray rocking curve) measurements. In cases of a crystal with a hexagonal crystal structure, the extent of the full width at half maximum of the XRC for the plane having a Miller index of (002) represents the tilt, i.e., the degree of c-axis variability, and the c-axis variability affects the flatness. The smaller the value, the fewer the screw dislocations there are. In other words, the flatness of the upper face of a crystal can be assessed based on the extent of the full width at half maximum of the XRC for (002) plane, and the extent of the FWHM affects the flatness of the layer that grows thereon. Given that InGaN is particularly difficult to grow flat as compared to GaN or the like, the smaller the c-axis variability of the underlying layer, the more preferable it is. Accordingly, in the case of forming an active layer that includes an InGaN layer, the smaller the full width at half maximum of the XRC for (002) plane in the first nitride semiconductor layer 12, or the like, that is formed underneath it, the more preferable it is. Furthermore, the extent of the full width at half maximum for the plane having a Miller index of (302) provides the information on twist, i.e., the extent of rotational displacement. The smaller the value, the fewer the edge dislocations there are. The effect of edge dislocations on the properties of the device is smaller than that of screw dislocations. They, however, become non-luminescent centers, and thus the fewer they are, the more preferable it is.

Here, the degree of crystal orientation of crystallographic c plane of the first nitride semiconductor layer 12 crystal is particularly important to the crystallinity of the second nitride semiconductor layer 13 stacked on the upper face of the first nitride semiconductor layer 12. Thus, the full width at half maximum of the XRC for the plane having a Miller index of (002) is preferably 1000 arcsec or less. By forming the first nitride semiconductor layer 12 so that the full width at half maximum of the XRC falls within the range described above, the second nitride semiconductor layer 13 stacked thereon can be formed with good crystallinity.

Forming a monocrystalline AlN thin film having a lattice constant close to that of the substrate 11 as the first nitride semiconductor layer 12 can improve the crystallinity of the second nitride semiconductor layer 13 made of a gallium nitride-based semiconductor.

The thickness of the first nitride semiconductor layer 12 is preferably in the range of from about 10 nm, which allows the first nitride semiconductor layer 12 to adequately coat the entire upper face of the substrate 11, to about 100 nm, which enhances the crystallinity of the second nitride semiconductor layer 13 to be stacked on the upper face thereof, more preferably in the range of from about 18 nm to about 50 nm, and even more preferably in the range of from about 20 nm to about 40 nm.

The oxygen concentration of the first nitride semiconductor layer 12 is preferably about 1% or higher. Having the oxygen concentration in this range can achieve the first nitride semiconductor layer 12 having an Al-polarized upper face in a stable manner. The oxygen concentration of the first nitride semiconductor layer 12, furthermore, is preferably about 10% or lower. Having the oxygen concentration in this range can achieve good crystallinity for the second nitride semiconductor layer 13 to be stacked on the first nitride semiconductor layer 12. The oxygen concentration of the first nitride semiconductor layer 12 as used herein refers to the concentration of the oxygen contained in the layer formed in the first sub-step of the first nitride semiconductor layer stacking step S102 discussed later.

The second nitride semiconductor layer 13 is stacked on the first nitride semiconductor layer 12. The second nitride semiconductor layer 13 is in direct contact with the surface of the first nitride semiconductor layer 12, and the crystal growth is typically carried out by MOCVD. In cases where the substrate 11 has protrusions 11a, the second nitride semiconductor layer 13 is grown to a thickness so that the unevenness created by the protrusions 11a is buried and the upper face becomes flat. For the second nitride semiconductor layer 13, a gallium nitride-based semiconductor having the composition expressed by $In_XAl_YGa_{1-X-Y}N$ ($0 \leq X$, $0 \leq Y$, $X+Y<1$) is preferably used, more preferably GaN is used. The upper face of the second nitride semiconductor layer 13 is formed into a flat-mirror-like surface, and is capable of allowing the light emitting device structure 14 to grow on the upper face with good crystallinity.

Upside-down hexagonal pyramid-shaped or upside-down hexagonal frustum-shaped recesses having side faces that are facets 13b are formed above the flat section 11b in an initial stage of crystal growth of the second nitride semiconductor layer 13. After the initial stage, the second nitride semiconductor layer 13 is formed to have a flat-mirror-like upper face during the process of crystal growth above the flat section 11b so as to substantially eliminate the recesses 13a by growing the second nitride semiconductor layer 13 before the thickness of the layer reaches preferably 800 nm, more preferably 500 nm. An upside-down hexagonal pyramid refers to the shape where a hexagonal pyramid is transposed upside down so that its bottom face is on the upper side, and an upside-down hexagonal frustum refers to the shape where a hexagonal frustum is transposed upside down so that its bottom face is on the upper side.

Allowing the crystal growth to proceed in this manner forms the second nitride semiconductor layer 13 above the flat section 11b so that at least some of the dislocations extending upwardly in the second nitride semiconductor layer 13 from the upper face of the first nitride semiconductor layer 12 are terminated at the height of 800 nm or lower, more preferably 500 nm or lower. For this reason, the region up to 800 nm from the upper face of the first nitride semiconductor layer 12 has a high density of crystal defects, such as dislocations, as compared to the region above the height of 800 nm from the first nitride semiconductor layer 12. In other words, the second nitride semiconductor layer 13 has a region higher than the 800 nm from the first nitride semiconductor layer 12 that has a lower crystal defect density than the region of up to 800 nm. The quantity of crystal defects can be confirmed by a cross-sectional CL image or cross-sectional TEM image. In the low crystal defect density region, the dislocation density is preferably $1 \times 10^8/cm^2$ at most. The lower limit value is not particularly limited, but the dislocation density is, for example, $1 \times 10^4/cm^2$ or higher. The thickness of the second nitride semiconductor layer 13 is not particularly limited, as long as it is formed to have a flat-mirror-like upper face after going through the crystal growth process described above.

In cases where the substrate 11 has protrusions 11a, moreover, it is preferable to form the second nitride semiconductor layer 13 in the thickness such that its upper face is located at a higher position than the upper ends of the protrusions 11a at the very least, and is further preferable to have the thickness to the extent of achieving flatness over the entire surface of the substrate 11, including the areas above the protrusions 11a. In this case, the dislocation density described above can be measured at a location higher than the protrusions 11a, for example, at the distance of about 5 µm from the substrate 11.

The light emitting device structure 14 is a nitride semiconductor layer stacked on the upper face of the second nitride semiconductor layer 13. It is typically formed continuously from the formation of the second nitride semiconductor layer 13 by MOCVD. In this embodiment, the light emitting device structure 14 has an LED structure in which an n-type semiconductor layer 14n, an active layer 14a, and a p-type semiconductor layer 14p are stacked. For the light emitting device structure 14, any materials suitable for semiconductor light emitting devices suffice, and for example, $In_XAl_YGa_{1-X-Y}N$ (0≤X, 0≤Y, X+Y<1), or the like, can suitably be used. The individual semiconductor layers that form the light emitting device structure 14 may be of a single layer structure, multilayer structure of different compositions and thicknesses, superlattice structure, or the like. The active layer 14a, in particular, is preferably of a single quantum well or multi-quantum well structure where quantum effect producing thin films are stacked.

The light emitting device structure 14 has a stepped section 14b in one region of its upper face where the p-type semiconductor layer 14p and active layer 14a are removed entirely, and the n-type semiconductor layer 14n is removed partially. The bottom face of the stepped section 14b is comprised of the n-type semiconductor layer 14n where an n-side electrode 15 is provided. A full surface electrode 16 is provided across the substantially entire upper face of the p-type semiconductor layer 14p. Furthermore, the remaining surface of the light emitting device structure 14, together with the n-side electrode 15 and the full surface electrode 16, is covered with an insulator 18.

The n-side electrode 15 and p-side electrode 17, connected to an external power supply each using a joining component, such as a metal wire, solder, or the like, are pad electrodes for supplying power to the light emitting device structure 14. The n-side electrode 15 is formed to be in contact with the n-type semiconductor layer 14n of the light emitting device structure 14 for which a single metal, such as Ag, Al, Ni, Rh, Au, Cu, Ti, Pt, Pd, Mo, Cr, W, or the like, for example, or an alloy having these metals as main components, can be used. Furthermore, these metal materials can be utilized in a single layer or multiple layers. In cases where an alloy is used, those containing a nonmetallic element as a constituent element, such as Si, for example, may also be used as in the case of an Al—Si—Cu alloy.

The full surface electrode 16, provided to cover substantially the entire upper face of the p-type semiconductor layer 14p, functions as a current diffusion layer to uniformly diffuse the current supplied from the outside via the p-side electrode 17 across the entire surface of the p-type semiconductor layer 14p. In cases where the nitride semiconductor device 1 is made into a face-up light emitting device whose upper face is the light extraction face, a light transmitting conductive material, such as for example, ITO (indium tin oxide), IZO (indium zinc oxide), or the like, is used for the full surface electrode 16. In cases where the nitride semiconductor device 1 is made into a face-down light emitting device whose lower face (i.e., substrate 11 side) is the light extraction face, it is preferable to use a material having good light reflectivity, particularly with respect to visible light, for at least the lower layer side of the full surface electrode 16 so as to function as a light reflecting layer to downwardly reflect the light emitted by the light emitting device structure 14. Such materials include, for example, Ag, Al, or alloys having these metals as main components. Alternatively, a light transmisive material may be employed for the full surface electrode 16, provided with a dielectric multilayer film and/or a light reflecting layer made of a metal film having good light reflectance formed thereon.

The p-side electrode 17, provided in one section of the upper face of the full surface electrode 16 to be connected to an external power supply using a joining component such as a metal wire, solder, or the like, is a pad electrode for supplying power to the light emitting device structure 14. For the p-side electrode 17, the same materials for the n-side electrode 15 described above can be used.

The insulator 18 is a film that covers the upper and side faces of the light emitting device structure 14 and full surface electrode 16. The insulator 18, moreover, also covers the upper and side faces of the n-side electrode 15 and p-side electrode 17, except for the section on each of the upper faces which serves as an external connection region. The insulator 18 functions as a protective film for the nitride semiconductor device 1. It is preferable for the insulator 18 to have good light transmittance particularly in cases where the nitride semiconductor device 1 is a face-up light emitting device. For the insulator 18, a metal oxide or metal nitride can be used, and for example, at least one oxide or nitride selected from the group consisting of Si, Ti, Zr, Nb, Ta, and Al can suitably be used. Incidentally, the insulator 18 may be omitted.

Method for Producing a Nitride Semiconductor Device

Figure 3:
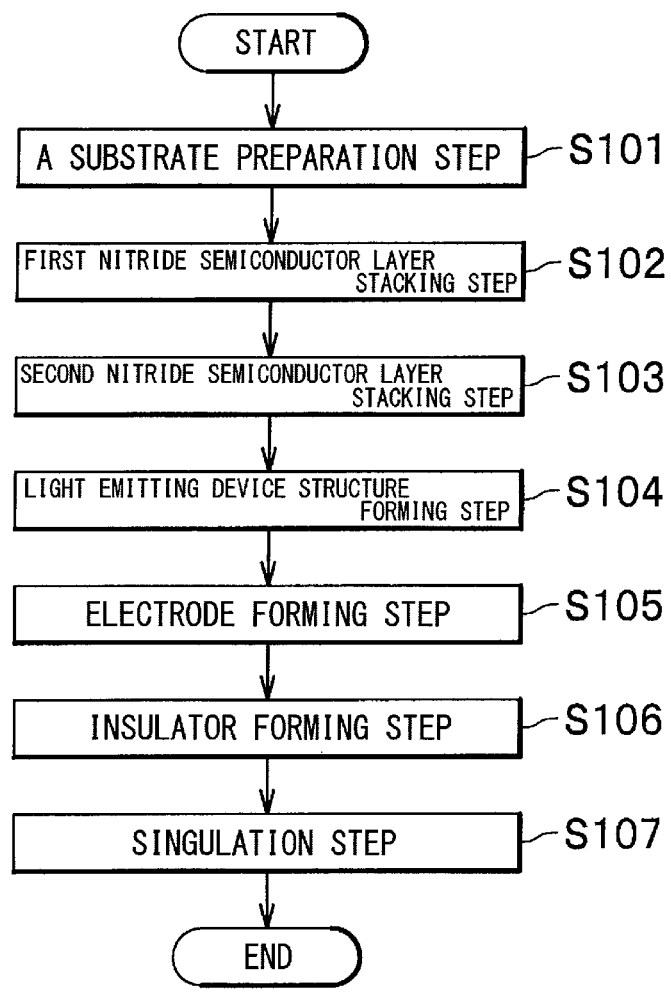
FIG. 3 is a flowchart showing the flow of the method for producing a nitride semiconductor device according to one embodiment.
Figure 4A:
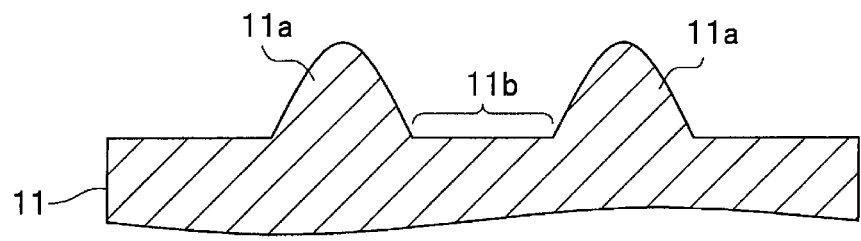
FIG. 4A is a schematic cross-sectional view illustrating the etching step, which is a sub-step of the substrate preparation step in the method for producing a nitride semiconductor device according to one embodiment.
Figure 4B:
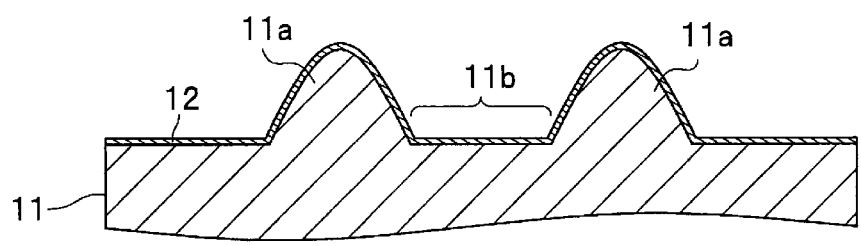
FIG. 4B is a schematic cross-sectional view illustrating the first nitride semiconductor layer stacking step in the method for producing a nitride semiconductor device according to one embodiment.
Figure 5A:
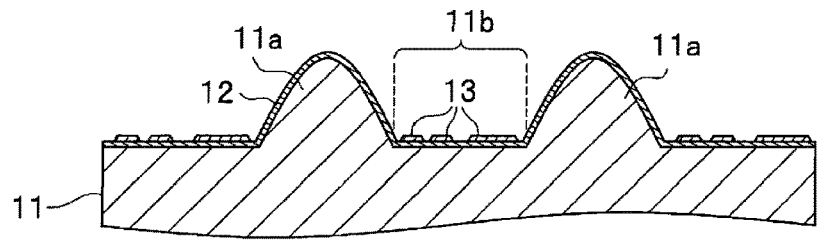
FIG. 5A is a schematic cross-sectional view illustrating the initial crystal growth stage of the second nitride semiconductor layer in the second nitride semiconductor layer stacking step in the method for producing a nitride semiconductor device according to one embodiment.

The method for producing a nitride semiconductor device 1 will be explained next with reference to FIGS. 2A to 7D. FIG. 3 is a flowchart showing the flow of the production steps for a nitride semiconductor device according to one embodiment. FIG. 4A is a schematic cross-sectional view illustrating the etching step, which is a sub-step of the substrate preparation step in the method for producing a nitride semiconductor device according to one embodiment. FIG. 4B is a schematic cross-sectional view illustrating the first nitride semiconductor layer stacking step in the method for producing a nitride semiconductor device according to one embodiment. FIG. 5A is a schematic cross-sectional view illustrating the initial crystal growth stage of the second nitride semiconductor layer in the second nitride semiconductor layer stacking step in the method for producing a nitride semiconductor device according to one embodiment.

Figure 5B:
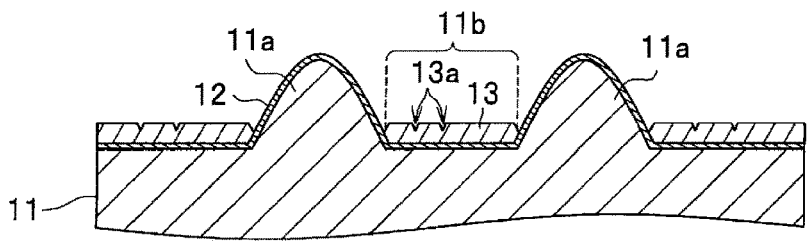
FIG. 5B is a schematic cross-sectional view illustrating a crystal growth stage of the second nitride semiconductor layer in the second nitride semiconductor layer stacking step in the method for producing a nitride semiconductor device according to one embodiment.
Figure 5C:
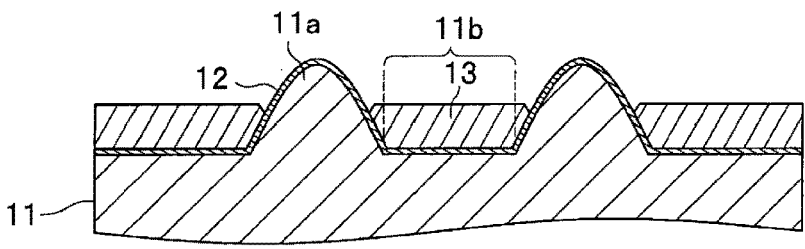
FIG. 5C is a schematic cross-sectional view illustrating an intermediate crystal growth stage of the second nitride semiconductor layer in the second nitride semiconductor layer stacking step in the method for producing a nitride semiconductor device according to one embodiment.
Figure 5D:
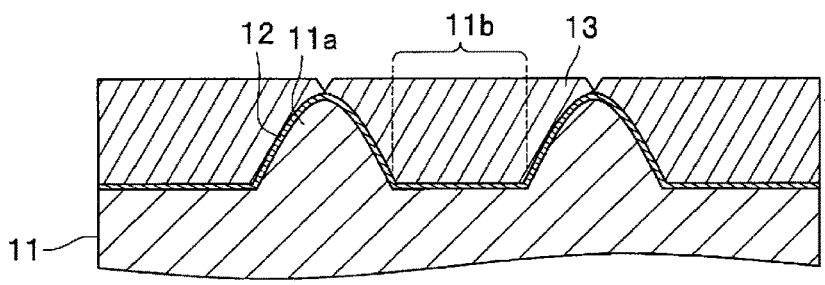
FIG. 5D is a schematic cross-sectional view illustrating an intermediate crystal growth stage of the second nitride semiconductor layer in the second nitride semiconductor layer stacking step in the method for producing a nitride semiconductor device according to one embodiment.

FIG. 5B is a schematic cross-sectional view illustrating an intermediate crystal growth stage of the second nitride semiconductor layer in the second nitride semiconductor layer stacking step in the method for producing a nitride semiconductor device according to one embodiment. FIG. 5C is a schematic cross-sectional view illustrating an intermediate crystal growth stage of the second nitride semiconductor layer in the second nitride semiconductor layer stacking step in the method for producing a nitride semiconductor device according to one embodiment. FIG. 5D is a schematic cross-sectional view illustrating an intermediate crystal growth stage of the second nitride semiconductor layer in the second nitride semiconductor layer stacking step in the method for producing a nitride semiconductor device according to one embodiment.

Figure 5E:
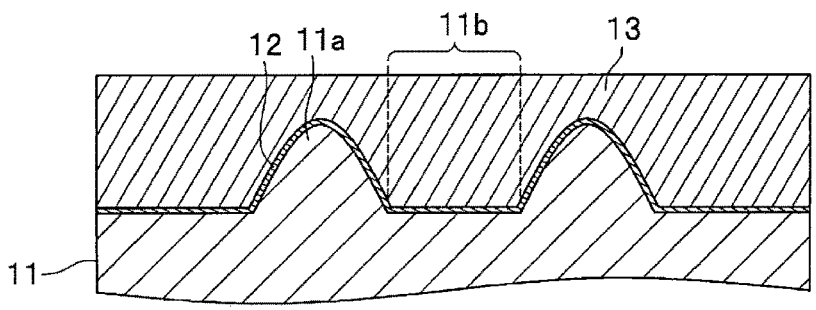
FIG. 5E is a schematic cross-sectional view illustrating a final crystal growth stage of the second nitride semiconductor layer in the second nitride semiconductor layer stacking step in the method for producing a nitride semiconductor device according to one embodiment.
Figure 6A:
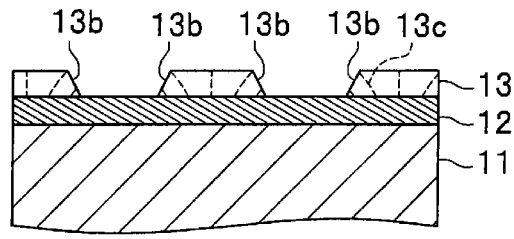
FIG. 6A is an enlarged cross-sectional view of a portion of the flat section shown in FIG. 5A.
Figure 6B:
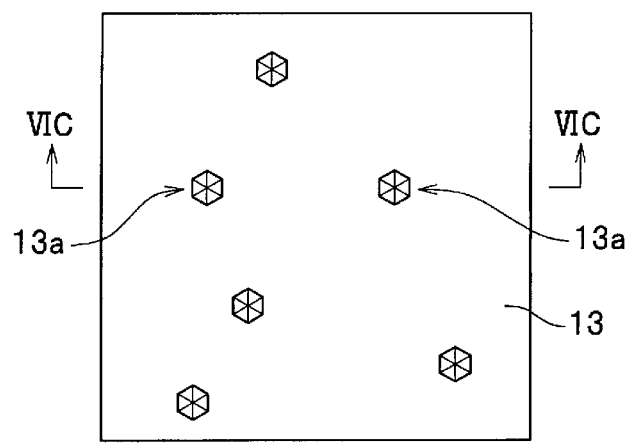
FIG. 6B is a schematic plan view of a portion of the flat section in the stage shown in FIG. 5B.
Figure 6C:
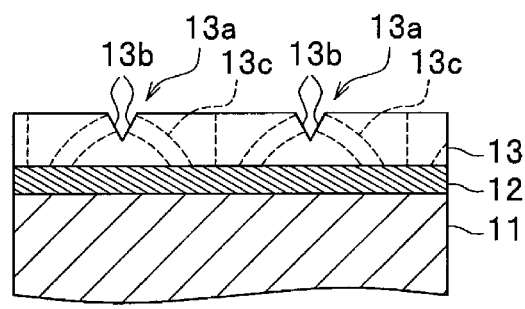
FIG. 6C is an enlarged cross-sectional view of a portion of the flat section shown in FIG. 5B, and is along line VIC-VIC indicated in FIG. 6B.
Figure 6D:
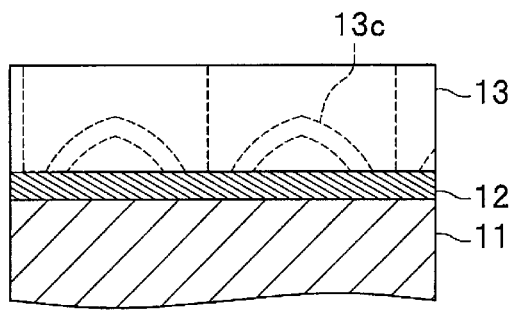
FIG. 6D is an enlarged cross-sectional view of a portion of the flat section shown in FIG. 5C.
Figure 7A:
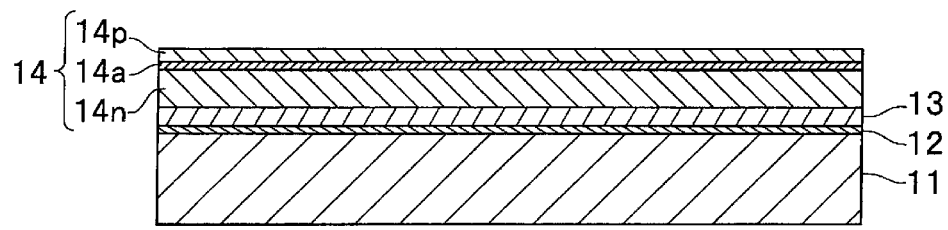
FIG. 7A is a schematic cross-sectional view illustrating a sub-step of the light emitting device structure forming step in the method for producing a nitride semiconductor device according to one embodiment.
Figure 7B:
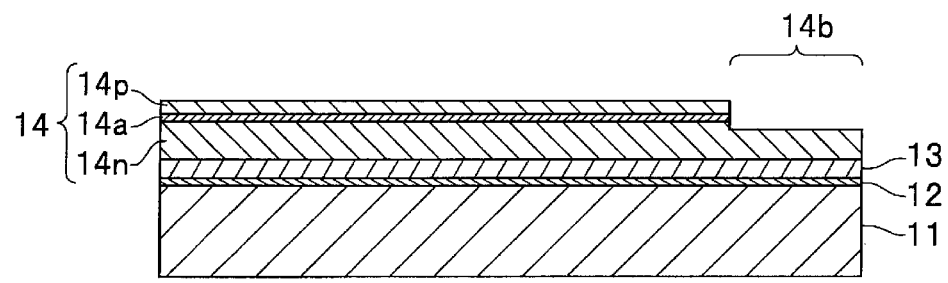
FIG. 7B is a schematic cross-sectional view illustrating a sub-step of the light emitting device structure forming step in the method for producing a nitride semiconductor device according to one embodiment.
Figure 7C:
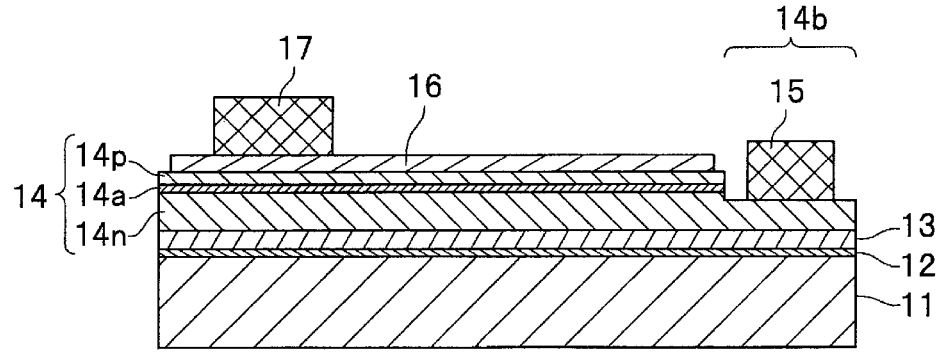
FIG. 7C is a schematic cross-sectional view illustrating the electrode forming step in the method for producing a nitride semiconductor device according to one embodiment.
Figure 7D:
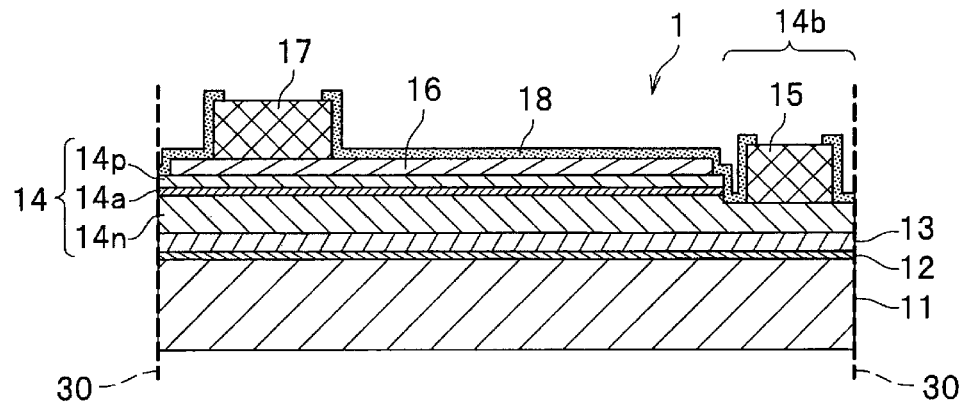
FIG. 7D is a schematic cross-sectional view illustrating the insulator forming step in the method for producing a nitride semiconductor device according to one embodiment.

FIG. 5E is a schematic cross-sectional view illustrating the final stage of crystal growth of the second nitride semiconductor layer in the second nitride semiconductor layer stacking step in the method for producing a nitride semiconductor device according to one embodiment. FIG. 6A is an enlarged cross-sectional view of a portion of the flat section shown in FIG. 5A. FIG. 6B is a schematic plan view of a portion of the flat section in the stage shown in FIG. 5B. FIG. 6C is an enlarged cross-sectional view of a portion of the flat section shown in FIG. 5B along line VIC-VIC indicated in FIG. 6B. FIG. 6D is an enlarged cross-sectional view of a portion of the flat section shown in FIG. 5C. FIG. 7A is a schematic cross-sectional view illustrating a sub-step of the light emitting device structure forming step in the method for producing a nitride semiconductor device according to one embodiment. FIG. 7B is a schematic cross-sectional view illustrating a sub-step of the light emitting device structure forming step in the method for producing a nitride semiconductor device according to one embodiment. FIG. 7C is a schematic cross-sectional view illustrating the electrode forming step in the method for producing a nitride semiconductor device according to one embodiment. FIG. 7D is a schematic cross-sectional view illustrating the insulator forming step in the method for producing a nitride semiconductor device according to one embodiment. Moreover, FIGS. 5A to 5E are cross-sectional views illustrating the stages of crystal growth of the second nitride semiconductor layer 13. FIGS. 6A, 6C, and 6D are cross-sectional views enlarging a portion of the flat section 11b in the cross-sectional views shown in FIGS. 5A, 5B, and 5C, respectively, schematically illustrating the dislocations occurring in the second nitride semiconductor layer 13 using broken lines. FIG. 6B is a plan view corresponding to FIG. 6C, and FIG. 6C is a cross-sectional view along line VIC-VIC indicated in FIG. 6B. In FIGS. 4A to 7D, the shapes, sizes, and positional relationship of the individual components might occasionally be simplified or exaggerated appropriately.

The method for producing a nitride semiconductor device 1 has a substrate preparation step S101, first nitride semiconductor layer stacking step S102, second nitride semiconductor layer stacking step S103, light emitting device structure forming step S104, electrode forming step S105, insulator forming step S106, and singulation step S107. Each step will be sequentially explained in detail below.

First, in the substrate preparation step S101, a substrate 11 is prepared. That is, a substrate 11 having protrusions 11a formed by etching, for example, on the principal plane side where the crystals of nitride semiconductor layers are to be grown is prepared. The substrate preparation step S101 includes, as sub-steps, a masking step to form a mask, and an etching step to etch the substrate 11 using the mask.

Protrusions 11a are formed on the upper face of the substrate 11 by forming a mask in the masking step, followed by, for example, dry etching the substrate 11 in the etching step. This, as a result, can form dome shaped protrusions 11a, for example, conical/pyramidal or semispherical in shape, having tilted side faces relative to c-axis which is perpendicular to the upper face of the substrate 11. A flat section 11b results in the remaining region where the protrusions 11a are absent.

The protrusions 11a may be formed into trigonal pyramids having curved side faces towards their tips by wet etching the substrate 11 after dry etching in the etching step. This further suppresses the crystal growth from the surfaces of the protrusions 11a.

Incidentally, a substrate 11 having a flat section 11b across the entire surface, without forming protrusions 11a, may also be used. In this case, it suffices to prepare a substrate 11 having a crystallographic +c plane as the principal plane (in the case of sapphire, Al-polar face) by omitting the sub-steps, masking and etching steps.

Next, in the first nitride semiconductor layer stacking step S102, a first nitride semiconductor layer 12 made of monocrystalline AlN is stacked on the substrate 11. The first nitride semiconductor layer 12 can be formed directly on the substrate 11 by MOCVD or sputtering. The first nitride semiconductor layer 12 is preferably formed by MOCVD. More specifically, in the case of forming the first nitride semiconductor layer 12 by MOCVD, TMA (trimethylaluminum) as the raw material for Al, a group III element, and $NH_3$ (ammonia) gas as the raw material for N, a group V element, can be used. For the carrier gas to supply these raw materials, $H_2$, $N_2$, or the mixture of the two, for example, can be used.

It is preferable to form the first nitride semiconductor layer 12 at a temperature of 800° C. or higher, more preferably 900° C. or higher. Setting the crystal growth temperature to the aforementioned lower limit value or higher can more successfully produce the first nitride semiconductor layer 12 that is monocrystalline. The crystal growth temperature, moreover, is preferably 1300° C. or lower, more preferably 1200° C. or lower. Setting the crystal growth temperature to the aforementioned upper limit value or lower can reduce the damage to the upper face of the substrate 11. The AlN layer grown by MOCVD at a low temperature outside such a temperature range would result in polycrystalline.

The thickness of the first nitride semiconductor layer 12 is preferably at least 10 nm so that the upper face can readily be Al-polar face uniformly, and is preferably 100 nm at most so that the layer is thin to the extent that the upper face of the AlN layer is uniformly Al-polar. It is preferable for the AlN layer to have a thickness in this range because the upper face readily becomes N-polar face if the AlN layer is formed into a thick layer.

In order to achieve good crystallinity, the volume for supplying the raw material gas for the group III element (e.g., TMA) used in MOCVD can be set to from about 5 sccm to about 20 sccm. The volume for supplying the raw material for the group V element (e.g., $NH_3$ gas), can be set to from about 1 sccm to about 10 sccm. Moreover, it is preferable to set the molar ratio of the group V element to group III element supplied (V/III ratio) at from about 7 to 700. The growth rate is preferably set to from about 0.01 nm/second to 1 nm/second. In this specification, sccm represents the flow rate ($cm^3$/min.) converted into the volume at a pressure of one atmosphere and a temperature of 25° C., while SLM mentioned later represents the flow rate (liter/min.) converted into the volume at a pressure of one atmosphere and at 25° C.

The thickness of the AlN layer, however, is not limited to the aforementioned range so long as the AlN layer covers the surface of the substrate 11 without any gaps, and the upper face of the AlN layer is uniformly Al-polar. The upper surface being uniformly Al-polar as used herein refers to the state where at least 50%, more preferably at least 90%, of the terminal atoms at the upper face of the AlN layer are Al. Moreover, the presence of N in a large number among the terminal elements at the upper surface of the AlN layer inhibits the successful growth of a GaN layer such that pits would remain on the upper face of the GaN layer even if it is formed to a thickness of 5 making it difficult to achieve a flat surface. In other words, the more N-polar the upper face of the AlN layer, the poorer the crystallinity of the GaN layer. The upper face of the AlN layer being dominantly Al-polar face enables the creation of the recesses 13a in the stages where the second nitride semiconductor layer 13 is preferably thinner than 800 nm, more preferably thinner than 500 nm, allowing the layer to grow to substantially eliminate the recesses 13a by growing the second nitride semiconductor layer 13 as discussed later.

The upper face of the first nitride semiconductor layer 12, as described earlier, is preferably uniformly Al-polar. For this purpose, it is preferable to form the first nitride semiconductor layer 12 while supplying oxygen until at least the entire upper face of the substrate 11 is covered in the first nitride semiconductor layer stacking step S102. Here, in the first nitride semiconductor layer stacking step S102, the step of forming the first nitride semiconductor layer 12 while supplying oxygen is referred to as the first sub-step, and the step of forming the first nitride semiconductor layer 12 while supplying no oxygen, or supplying oxygen at a lower concentration than that of the first sub-step, is referred to as the second sub-step.

In the first sub-step, the entire upper face of the substrate 11 is coated with the first nitride semiconductor layer 12 while supplying oxygen at from about 0.01 sccm to about 0.1 sccm, more preferably from about 0.02 sccm to about 0.06 sccm (oxygen may be supplied at a target flow rate by mixing it with an inert gas such as Ar, or oxygen may be directly supplied at a target flow rate). This will allow for the further growth of the first nitride semiconductor layer 12 thereon which will have Al-polar (crystallographic +c plane) upper face in a stable manner. The addition of oxygen is believed to suppress the first nitride semiconductor layer 12 from becoming N-polar (crystallographic −c plane), thereby stabilizing the growth of the first nitride semiconductor layer 12.

In the second sub-step, crystal growth of the first nitride semiconductor layer 12 is continued from the first sub-step while supplying oxygen at a lower flow rate than the first sub-step, or without supplying oxygen. This increases the crystallinity of the first nitride semiconductor layer 12. This, as a consequence, also increases the crystallinity of the second nitride semiconductor layer 13 which is stacked on the first nitride semiconductor layer 12, which has crystallinity, producing a flat crystalline surface at the upper face. In the case of reducing the flow rate of oxygen supplied in the second sub-step, the rate may be reduced in stages, or continuously, from the oxygen flow rate used in the first sub-step.

Next, in the second nitride semiconductor layer stacking step S103, a second nitride semiconductor layer 13 made of a gallium nitride-based semiconductor having the composition expressed by $In_XAl_YGa_{1-X-Y}N$ ($0 \leq X$, $0 \leq Y$, $X+Y<1$) is stacked on the first nitride semiconductor layer 12. The second nitride semiconductor layer 13 is typically formed by MOCVD. It is preferable to grow the second nitride semiconductor layer 13 undoped. It is more preferable to use undoped GaN for the second nitride semiconductor layer 13. The second nitride semiconductor layer 13 grown undoped typically has the concentration of p-type and n-type impurities of lower than the detection limit by a SIMS analysis (secondary ion mass spectrometry), for example, $1 \times 10^{17}$ $cm^{-3}$ or less. For the raw materials for group III elements, In, Al, and Ga, for example, TMI (trimethylindium), TMA, TMG (trimethylgallium), can be used respectively. $NH_3$, for example, can be used for the raw material for N, a group V element.

The thickness of the second nitride semiconductor layer 13 is not particularly limited, so long as it is greater than the thickness that buries the recesses 13a created in the process of crystal growth, and produces a flat-mirror-like upper face. In cases where the substrate 11 has protrusions 11a, it suffices for the second nitride semiconductor layer 13 to have the thickness so that its upper face is higher than the upper ends of the protrusions 11a while achieving a flat-mirror-like surface.

Various conditions for forming the second nitride semiconductor layer 13 by MOCV will be explained. It is preferable to set the temperature to at least 800° C., but 1100° C. at most. The volume of the group III source gas (e.g., TMG) supplied can be set to at least about 5 sccm, but about 80 sccm at most. The volume of the group V source gas (e.g., $NH_3$ gas) is preferably set to at least about 1 SLM, but about 20 SLM at most. The molar ratio of the group V element to that of the group III element supplied is preferably at least about 30, but about 30000 at most. The preferable growth rate, moreover, is at least about 250 nm/hour, but about 25 µm/hour at most. The pressure is not particularly limited, but can be set to from about 0.5 atmospheres to about 1 atmosphere. These conditions can form the second nitride semiconductor layer 13 having a low crystal defect density in the upper region of at least 800 nm or higher, more preferably at least 500 nm or higher, as well as having a flat-mirror-like upper face.

Here, the crystal growth of the second nitride semiconductor layer 13 will be explained with reference to FIGS. 5A to 6D. The case of using GaN as the second nitride semiconductor layer 13 will be explained below unless otherwise noted, but the same applies to nitride semiconductors of other compositions. During the crystal growth process of the second nitride semiconductor layer 13, in the initial stage, micronuclei are formed in multiple locations on the upper face of the first nitride semiconductor layer 12 formed in the flat section 11b of the substrate 11. The second nitride semiconductor layer 13 is such that facets 13b tilted relative to c-axis, which is perpendicular to the principal plane of the substrate 11, are formed as side faces, and these micronuclei grow upwardly while proceeding with lateral faceted growth. The upper face of the first nitride semiconductor layer 12 formed on the flat section 11b is monocrystalline AlN crystallographic +c plane, and allows for good crystal growth of the second nitride semiconductor layer 13 made of GaN. The second nitride semiconductor layer 13 primarily grows on a crystallographic +c plane, which is the flat section 11b, and the crystal growth is suppressed on the protrusions 11a which are non-c planes.

Given the fact that AlN and GaN have different lattice constants, a large number of dislocations 13c are generated in the second nitride semiconductor layer 13, and the dislocations 13c propagate in the directions of crystal growth. For this reason, if the second nitride semiconductor layer 13 were grown only in the upward direction, the dislocations 13c would become penetration dislocations that penetrate the upper face, which would result in a large number of dislocations 13c also propagating in the light emitting device structure 14 which will be stacked on the upper face of the second nitride semiconductor layer 13.

In this embodiment, dislocations 13c are believed to propagate laterally because of the lateral faceted growth of the second nitride semiconductor layer 13. For this reason, as the crystal growth progresses, the region where dislocations 13c do not appear on the upper face side of the second nitride semiconductor layer 13 increases.

Furthermore, the second nitride semiconductor layer 13 which performed faceted growth from multiple micronuclei join together. In a plan view, the joined micronuclei create recesses 13a that are upside-down hexagonal pyramid or upside-down hexagonal frustum (better yet upside-down regular hexagonal pyramid or upside-down regular hexagonal frustum) in shape. The facets 13b make up the inner side faces of the recesses 13a. The diameters of the recesses 13a in a plan view is about 100 nm to about 200 nm.

If the rate of crystal growth is too high when forming the second nitride semiconductor layer 13, the crystallinity tends to degrade. In other words, if the rate of crystal growth is too high, the recesses 13a do not assume neat shapes of upside-down hexagonal pyramids or upside-down hexagonal frusta, nor does the upper face become flat, readily allowing bumps and dents to remain on the upper face. This is believed to be because too high a crystal growth rate makes the vertical growth too fast relative to the lateral faceted growth, which increases the gaps in the crystal height and orientation when the facets 13b of GaN grown from different micronuclei are joined together. The dislocations 13c exposed at the facets 13b therefore are believed to propagate upwardly without being terminated even when the facets 13b are joined.

Accordingly, the second nitride semiconductor layer 13 is grown at the crystal growth rate which allows for the recesses 13a to be substantially eliminated by growing the second nitride semiconductor layer 13 before the thickness of the second nitride semiconductor layer 13 reaches preferably 800 nm, more preferably 500 nm. The rate of crystal growth can be controlled by the source gas flow rates, molar ratio of the group V element to the group III element supplied, and reaction temperature.

When the crystal growth of the second nitride semiconductor layer 13 is further continued, the recesses 13a are substantially eliminated by growing the second nitride semiconductor layer 13, and the second nitride semiconductor layer 13 is further formed thereabove. It is further believed that the lateral faceted growth and substantially eliminating the recesses by growing the second nitride semiconductor layer 13 stop the laterally propagating dislocations 13c from appearing at the surface of the second nitride semiconductor layer 13. The upper face of the second nitride semiconductor layer 13 formed thereafter becomes mirror-like and flat. Moreover, the recesses 13a are substantially eliminated by growing the second nitride semiconductor layer 13 before the thickness of the second nitride semiconductor layer 13 reaches preferably 800 nm, more preferably 500 nm. Thus, at least some of the dislocations 13c upwardly extending in the second nitride semiconductor layer 13 from the upper face of the first nitride semiconductor layer 12 are terminated at 800 nm or lower, more preferably 500 nm or lower. As a result, the number of the dislocations 13c further extending upwardly is reduced. Substantially eliminating the recesses by growing the second nitride semiconductor layer 13 in such a stage where the thickness is very small is believed to allow the facets to join together at a substantially uniform height. This makes it difficult for crystal defects, such as dislocations, to occur at the sections where the facets are joined, which consequentially reduces the number of crystal defects.

Accordingly, on the flat section 11b, the second nitride semiconductor layer 13 has a high crystal defect density section in the region up to 800 nm in height from the upper face of the first nitride semiconductor layer 12 as compared to the region above 800 nm of that. In other words, in the region higher than 800 nm in height from the upper face of the first nitride semiconductor layer 12, the crystal defect density is reduced as compared to the region up to 800 nm.

In cases where the substrate 11 has protrusions 11a, moreover, the height at which the recesses 13a are substantially eliminated by growing the second nitride semiconductor layer 13 is preferably lower than the upper ends of the protrusions 11a. In other words, it is preferable to substantially eliminate the recesses 13a by growing the second nitride semiconductor layer 13 before the second nitride semiconductor layer 13 which has achieved lateral crystal growth joins together above the protrusions 11a. This can effectively reduce the crystal defect density in the flat section 11b. The upper ends of the protrusions 11a refers to the apices if the protrusions 11a are conical/pyramidal in shape, and the upper bases if the protrusions 11a are frusta.

Moreover, in the regions where the protrusions 11a are present, substantially no crystal growth occurs from the slanted side faces of the protrusions 11a, and the protrusions 11a are primarily buried by the second nitride semiconductor layer 13 laterally grown from the flat section 11b. Accordingly, the dislocations 13c propagating in the second nitride semiconductor layer 13 converge above the protrusions 11a. Thus, the number of dislocations 13c above the protrusions 11a of the second nitride semiconductor layer 13 decreases. However, the method of this embodiment described above can reduce the number of dislocations 13c above the flat section 11b regardless of the presence or absence of protrusions 11a. Therefore, the layout or the like of the protrusions 11a can be designed for the primary purpose of increasing the light extraction efficiency without having to consider reducing the dislocation density.

As explained above, providing a monocrystalline thin film AlN layer as the first nitride semiconductor layer 12 can reduce the crystal defect density of the upper region of the second nitride semiconductor layer 13 grown on the flat section 11b of the substrate 11. Furthermore, providing protrusions 11a on the substrate 11 can converge the dislocations 13c over the apices of protrusions 11a, thereby also reducing the crystal defect density of the second nitride semiconductor layer 13 grown on the protrusions 11a.

The explanation of the method for producing a nitride semiconductor device 1 will be continued. Next, in the light emitting device structure forming step S104, a light emitting device structure 14 is formed on the second nitride semiconductor layer 13 by sequentially stacking an n-type semiconductor layer 14n, an active layer 14a, and a p-type semiconductor layer 14p by MOCVD. Given that the step of stacking each semiconductor layer by MOCVD can be performed in the same manner as in the second nitride semiconductor layer stacking step S103. Since the upper layer section of the second nitride semiconductor layer 13 is formed to have a low crystal defect density, the light emitting device structure 14, which is a nitride semiconductor stack, can be formed with good crystallinity on the second nitride semiconductor layer 13. Incidentally, the second nitride semiconductor layer 13 may be a part of the light emitting device structure 14, and can form a part of the n-type semiconductor layer 14n, for example, by being doped with n-type impurities. However, for the purpose of reducing dislocation density, it is preferable to form the second nitride semiconductor layer 13 undoped.

A sub-step in the light emitting device structure forming step S104, moreover, forms a stepped section 14b after stacking the n-type semiconductor layer 14n, active layer 14a, and p-type semiconductor layer 14p by etching off the p-type semiconductor layer 14p and active layer 14a entirely, and the n-type semiconductor layer 14n partially, from the upper face in one region of the p-type semiconductor layer 14p. This exposes the n-type semiconductor layer 14n at the bottom face of the stepped section 14b.

Then, in the electrode forming step S105, an n-side electrode 15, a full surface electrode 16, and a p-side electrode 17 are formed. First, a full surface electrode 16 is formed so as to cover substantially the entire upper face of the p-type semiconductor layer 14p. Next, an n-side electrode 15 is formed at the bottom face of the stepped section 14b and a p-side electrode 17 is formed in one section of the upper face of the full surface electrode 16. In cases where the same material is used to form the n-side electrode 15 and p-side electrode 17, they can be formed simultaneously. Alternatively, the n-side electrode 15 and p-side electrode 17 can be formed in separate steps using different materials. As for the electrode forming step S105, the steps for forming individual electrodes may be performed continuously, or another step may be interposed between them. For example, after forming the full surface electrode and p-side electrode, the p-side electrode is joined to the supporting substrate, followed by removing the substrate and then forming the n-side electrode on the face from which the substrate has been removed.

Next, in the insulator forming step S106, an insulator 18 is formed using an insulating material, such as $SiO_2$, excluding one section of each of the upper faces of the n-side electrode 15 and p-side electrode 17.

In cases where multiple nitride semiconductor devices 1 are formed on one substrate 11 by wafer level processing, nitride semiconductor devices 1 are singulated in the subsequent singulation step S107 by cutting the wafer along the virtual boundary lines 30 that define the individual nitride semiconductor devices 1 by laser scribing, cutter scribing, dicing, or the like. The substrate 11 may be reduced in thickness by polishing the rear face before cutting the wafer, or the substrate 11 may be removed by LLO (laser lift-off) before or after cutting the wafer. The nitride semiconductor devices 1 are created by the steps described above.

Figure 8A:
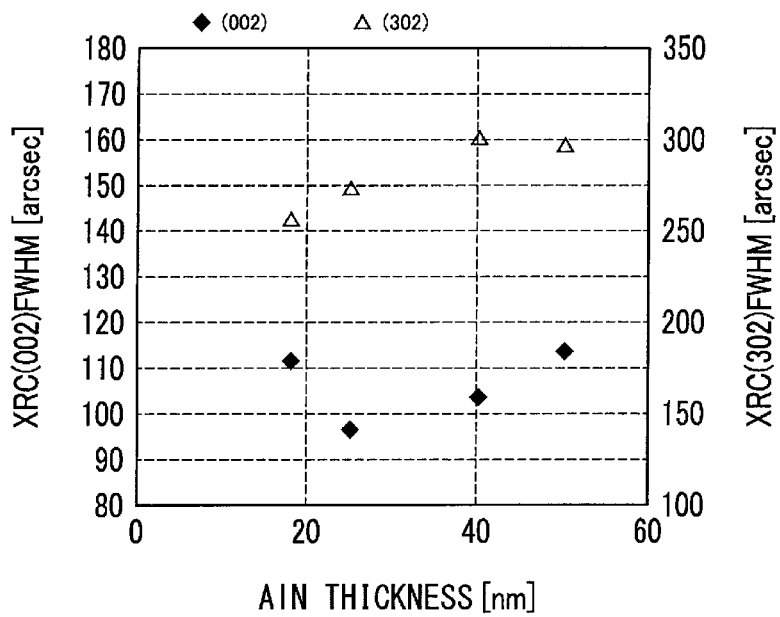
FIG. 8A is a graphical representation showing the relationship between the thickness of the AlN layer, the first nitride semiconductor layer, and the full width at half maximum (FWHM) of the X-ray rocking curves (XRC) of the GaN layer, the second nitride semiconductor layer, in the nitride semiconductor device according to one embodiment.
Figure 8B:
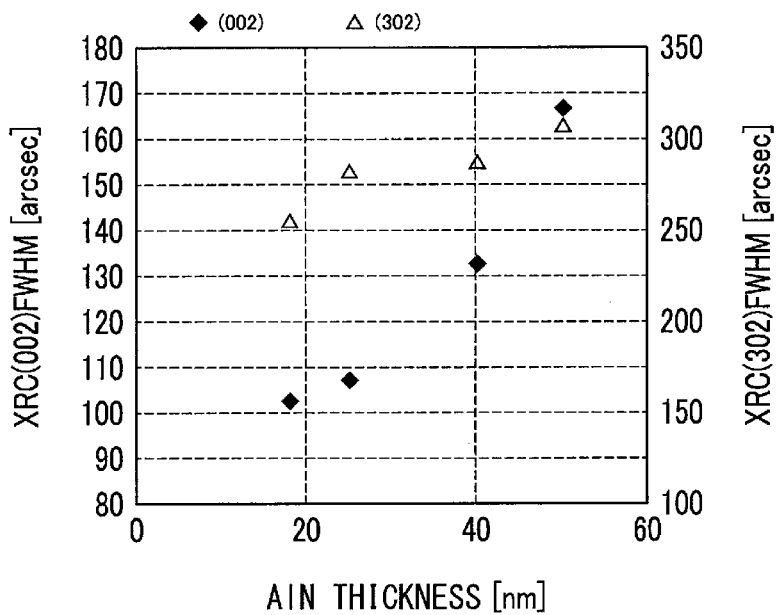
FIG. 8B is a graphical representation showing the relationship between the thickness of the AlN layer, the first nitride semiconductor layer, and the full width at half maximum (FWHM) of the X-ray rocking curves (XRC) of the GaN layer, the second nitride semiconductor layer, in the nitride semiconductor device according to one embodiment.

Experiments to Confirm the Relationship between AlN Layer Thickness and GaN Layer Crystallinity The results of experiments performed to confirm the relationship between the thickness of the AlN layer (first nitride semiconductor layer 12) and the crystallinity of the GaN layer (second nitride semiconductor layer 13) stacked on the AlN layer will be explained next with reference to FIGS. 8A and 8B. FIGS. 8A and 8B are graphical representations of the relationship between the thickness of the first nitride semiconductor layer, AlN layer, and the full width at half maximum (FWHM) of the X-ray rocking curve (XRC) of the second nitride semiconductor layer, GaN layer, of the nitride semiconductor device according to this embodiment. The test results shown in FIGS. 8A and 8B represent the full width at half maximum of the XRC measured at different positions on the same samples. The XRCs for the first nitride semiconductor layer 12 were measured without forming the second nitride semiconductor layer 13, i.e., in the state where only the first nitride semiconductor layer 12 is formed. Similarly, the XRCs for the second nitride semiconductor layer 13 were measured without forming anything thereon.

Using a sapphire substrate having a crystallographic +c plane as the principal plane for the substrate 11, the first nitride semiconductor layer 12, AlN layer, was grown to a thickness of 18, 25, 40, or 50 nm. The AlN layers were formed under the conditions: temperature 1000° C., pressure 200 torr (26.7 kPa), and growth rate about 0.1 nm/second. The second nitride semiconductor layer 13, GaN layer, was formed through crystal growth to a thickness of about 5 μm on the upper face of the AlN layer having each thickness. Incidentally, with respect to the AlN layer formed to a thickness of 40 nm, the full width at half maximum of the XRC for the plane having a Miller index of (002) was 313 arcsec.

The tendency found was that the thicker the AlN layer, the poorer the crystallinity of the GaN layer formed thereon. Accordingly, the thickness of the AlN layer is preferably 100 nm at most, more preferably 50 nm at most. Moreover, in order to readily make the upper face of the AlN layer uniformly Al-polar, the thickness of the AlN layer is preferably at least 10 nm, more preferably at least 18 nm.

Confirmation of AlN Layer Crystallinity

Figure 9:
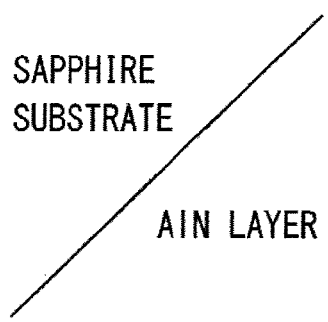
FIG. 9 is a photograph of an electron diffraction pattern of the AlN layer, the first nitride semiconductor layer, in the nitride semiconductor device according to one embodiment.
Figure 9:
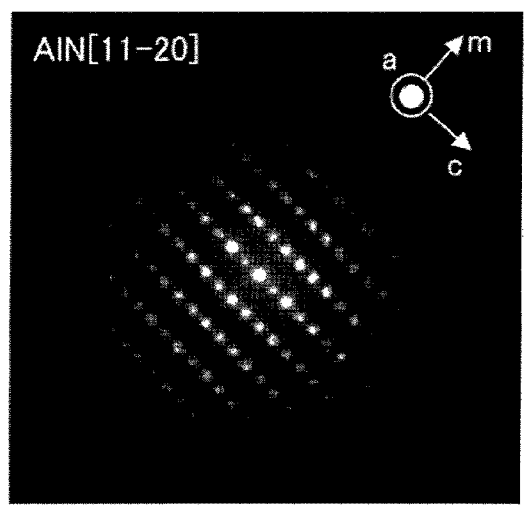

Next follows an explanation of determining whether or not the first nitride semiconductor layer 12, AlN layer, is monocrystalline is made with reference to FIG. 9. FIG. 9 is a photograph showing an electron diffraction pattern of the first nitride semiconductor layer, AlN layer, of the nitride semiconductor device according to the embodiment. As indicated by arrows in FIG. 9, the crystal orientation is such that the direction perpendicular to the surface of the photograph is a-axis of the AlN layer, the right downward direction in the photo image plane is c-axis, and the right upward direction in the photo image plane is m-axis. In other words, the plane parallel to the photo image surface (paper surface) is [11-20] plane, i.e., a-plane, and the plane perpendicular to c-axis is a crystallographic c plane. As shown in the left hand side diagram of FIG. 9, the sapphire substrate and the AlN layer have the positional relationship where the sapphire substrate is positioned at the upper left, and the AlN layer the lower right.

As described earlier, the fact that the AlN layer is monocrystalline can be confirmed by the electron diffraction pattern of a two-dimensional spot array forming a net pattern (i.e., lattice patterned spots). When considered in combination with the positional relationship between the sapphire substrate and AlN layer, the upper face of the AlN layer is found to be +c plane (i.e., Al-polar face).

Figure 10:
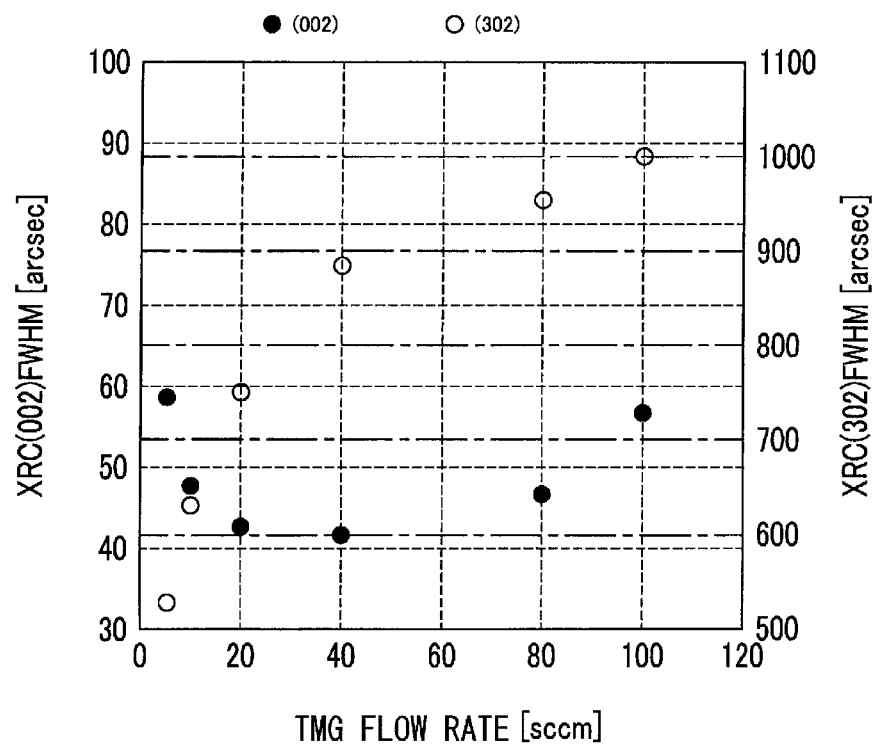
FIG. 10 is a graphical representation showing the relationship between an flow rate of TMG a gallium source gas, supplied during the second nitride semiconductor layer stacking step and the full width at half maximum (FWHM) of the X-ray rocking curves (XRC) of the GaN layer, the second nitride semiconductor layer, in the nitride semiconductor device according to one embodiment.

Experiments to Confirm the Relationship Between the GaN Layer Crystal Growth Rate and Crystallinity Next, the results of experiments conducted to confirm the relationship between the crystal growth rate during the formation of the GaN layer as the second nitride semiconductor layer 13 and the crystallinity of the GaN layer will be explained with reference to FIG. 10. FIG. 10 is a graphical representation showing the relationship between the flow rate of TMG, a gallium source gas, supplied during the second nitride semiconductor layer stacking step and the full width at half maximum (FWHM) of the X-ray rocking curves (XRC) of the second nitride semiconductor layer, the GaN layer, in the nitride semiconductor device according to this embodiment.

In these experiments, GaN was used as the second nitride semiconductor layer 13, and a different flow rate of TMG, a Ga source, of 5, 10, 20, 40, 80, or 100 sccm was used to vary the crystal growth rate for the GaN layer. The GaN layer was formed to have a thickness of 1 Other process conditions were set as follows: temperature 1000° C., pressure 1 atmosphere, and growth rate about 2.5 μm/hour (0.7 nm/second). The V/III ratio was about 3000. Using a sapphire substrate having a crystallographic +c plane as the principal plane for the substrate 11, the first nitride semiconductor layer 12, the AlN layer, was formed to a thickness of 30 nm.

The full width at half maximum of the XRCs were adequately small for both planes having Miller indices of (002) and (302) at all TMG flow rates within the range in the experimental conditions described above, resulting in GaN layers with good crystallinity. On the other hand, a tendency was found that the higher the TMG flow rate, i.e., the higher the GaN layer crystal growth rate, the greater the full width at half maximum for both planes generally became, i.e., the poorer the crystallinity became. Another tendency, moreover, was found that the smaller the TMG flow rate than 20 sccm is, the greater the full width at half maximum for the plane having a Miller index of (002) became. Accordingly, under these experimental conditions, it is preferable to set the TMG flow rate at 5 to 100 sccm, more preferably 20 to 40 sccm.

The lateral growth of the GaN layer in the initial stage, in which the GaN layer is grown up to about 100 nm in thickness is believed to have an very large impact on both the degree of tilt of the GaN crystal indicated by the full width at half maximum of the XRC for (002) plane and the degree of twist of the GaN crystal indicated by the full width at half maximum of the XRC for (302) plane. In particular, the flatness of the GaN layer in the initial stage is believed to have a large impact on the degree of tilt, and the faceted growth, which is the lateral growth in the initial stage is believed to have a very large impact on the degree of twist.

GaN Layer Crystal Growth Examples

Figure 11:
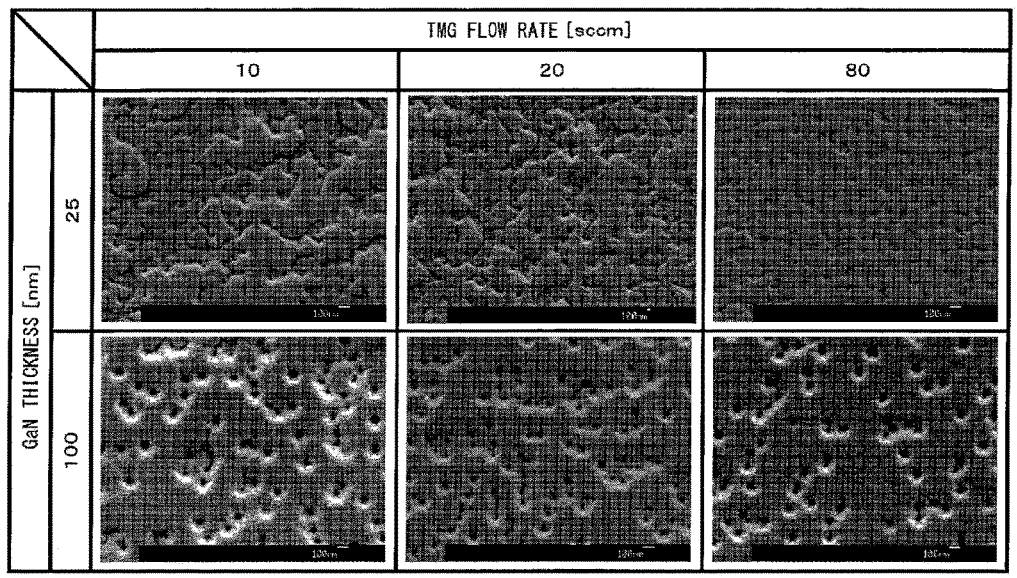
FIG. 11 shows scanning electron micrographs (SEM images) of the upper face of the GaN layer, the second nitride semiconductor layer of the nitride semiconductor device according to one embodiment of the invention in the intermediate stages of crystal growth.

Next, specific examples of the crystal growths in the GaN layer formed under the experimental conditions described above will be explained with reference to FIG. 11. FIG. 11 shows scanning electron micrographs (SEM images) of the upper faces of the GaN layers, the second nitride semiconductor layers, of the nitride semiconductor device according to the embodiment in the intermediate stages of crystal growth. The images in FIG. 11 show the process of crystal growth of the second nitride semiconductor layers 13 using GaN over the flat section 11b of the substrate 11 captured from the top using a scanning electron microscope (SEM). FIG. 11 shows the upper faces of the GaN layers when formed to thicknesses of 25 nm and 100 nm in the examples where the crystal growth rate was varied among three levels by setting the TMG flow rate to 10, 20, or 80 sccm. The stage where the GaN layers have grown to 25 nm in thickness in FIG. 11 corresponds to the stage shown in FIG. 6A, while the stage where the GaN layers have grown to 100 nm in thickness corresponds to the stage shown in FIGS. 6B and 6C.

At the stage where the GaN layer has grown to 25 nm in thickness, the GaN in the flat section 11b covered the flat section 11b while proceeding with a lateral faceted growth in the TMG flow rate range for which the experimental results were shown. The stage where the GaN layer has grown to 100 nm in thickness, moreover, is the final stage of the faceted growth on the flat section 11b where the GaN crystal which performed faceted growth from multiple micronuclei have joined, and the upside-down hexagonal pyramid-shaped or upside-down hexagonal frustum-shaped recesses 13a have been formed. At this stage, furthermore, the upper face of the flat section 11b in the region other than where the recesses 13a were created, was substantially flat.

Imaging of Crystal Defect Distribution by CL

Figure 12:
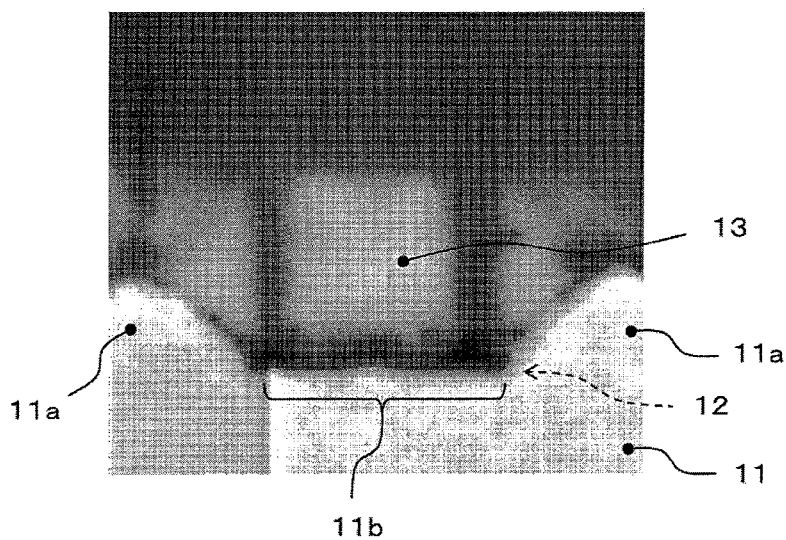
FIG. 12 is a micrograph of a cross-sectional cathode luminescence image of the nitride semiconductor device according to one embodiment.

Next, the distribution of crystal defects in the nitride semiconductor made by stacking an AlN layer as the first nitride semiconductor layer 12 and a GaN layer as the second nitride semiconductor layer 13 on the sapphire substrate 11 will be explained with reference to FIG. 12. FIG. 12 is a photograph of a cross-sectional cathodoluminescence image of the nitride semiconductor device according to the embodiment. In FIG. 12, the region shown in black near the interface with the substrate 11 is where crystal defects are present. Most of the central section of FIG. 12 is shown in white, and the upper third region is shown in gray. This is due to the carrier concentration difference, and the upper gray region has reduced number of crystal defects with a low dislocation density, as in the case of the white region immediately below that. It is inferred that most of the central section in FIG. 12 is shown in white because the faceted growth continues until the apices of the protrusions 11a is substantially eliminated by growing the second nitride semiconductor layer 13 up to its above, readily incorporates impurities, increasing the carrier concentration even though it was grown undoped. Undoped GaN should normally be shown in gray as in the case of the upper region of FIG. 12. There are gray sections upwardly extending from the regions near the edges of the flat section 11b. Similarly, it is likely that these regions are shown in gray because the carrier concentration was low in the localized sections.

The dimensions of each of the protrusions 11a (see FIG. 2B) are about 1.5 μm in height H, about 2 μm in width W, and about 3.5 μm in pitch (spacing G+width W). The region shown in black above the flat section 11b of the substrate 11 has a large number of crystal defects, such as dislocations, i.e., it is the region where the crystal defect density is high. The first nitride semiconductor layer 12, AlN layer, cannot be distinguished in the image because it is very thin compared to the second nitride semiconductor layer 13, GaN layer, but is formed to a thickness of about 30 nm.

On the flat section 11b, the GaN layer is shown in white in the region at the height of about 500 nm or higher from the upper face of the AlN layer, revealing that the number of crystal defects such as dislocations is greatly lessened. In this region, no crystal defects such as dislocations are recognized. In other words, the number of dislocations in this region can be said to be zero. Moreover, among the regions above the flat section 11b, except for the edges, the region at the height of about 500 nm or higher is inferred to be the region of crystal growth resulting in a flat upper face. The region higher than the white region is shown in gray. This region also has reduced number of dislocations where crystal growth progressed resulting in a flat-mirror-like upper face.

In other words, on the flat section 11b, at the stage where the GaN layer was formed to about 500 nm, the upper face became flat, and the dislocations were terminated without propagating upwardly. Moreover, in the region higher than the upper ends of the protrusions 11a, the upper face of the GaN layer is flattened across the entire region in a plan view. If the specific AlN layer described above were not provided, the crystal defects in the vicinity of the interface with the substrate might have extended beyond the protrusions and converged, but the phenomenon of terminating and eliminating the majority of the crystal defects at a lower position than the upper ends of the protrusions 11a could not have occurred. From this, a conclusion can be drawn that the number of crystal defects on the flat section 11b decreased because the specific AlN layer provided as described above allowed the second nitride semiconductor layer 13 to achieve faceted growth in the stages where its thickness was very thin.

As explained above, it was confirmed that a buffer layer having a flat upper face having reduced number of dislocations passing through the upper face can be formed simply by forming a monocrystalline thin film AlN layer in the flat section 11b on the substrate 11, and growing a GaN layer on the AlN layer to a relatively small thickness of at least 800 nm, more preferably at least 500 nm. Therefore, a nitride semiconductor having reduced number of crystal defects, such as dislocations, and good crystallinity can be stacked on the upper face of the second nitride semiconductor layer 13. This, as a result, can improve the quality of a nitride semiconductor device 1 having a functional element, such as a light emitting device structure 14, including such a nitride semiconductor.

The nitride semiconductor device and the method for producing same according to the present disclosure have been specifically explained based on one embodiment in the foregoing. The spirit and scope of the present disclosure, however, are not limited to those disclosed above, and must be broadly interpreted based on what is set forth in the claims section. It goes without saying that various modifications and variations made based on the disclosure are within the spirit and scope of the present disclosure.

What is claimed is:

1. A method for producing a nitride semiconductor device comprising:
    providing a substrate made of a material other than a nitride semiconductor,
    wherein the material has a hexagonal crystal structure;
    wherein the substrate has a plurality of protrusions;
        wherein the substrate has an at least one flat section of an upper face of the substrate positioned between at least two protrusions;
    growing a first nitride semiconductor layer on the upper face of the substrate,
        wherein the first nitride semiconductor layer is made of monocrystalline AlN;
        wherein the first nitride semiconductor layer has an upper face that is a +c plane;
        wherein the first nitride semiconductor layer has a thickness in a range of 10 nm to 100 nm;
        wherein at least part of the first nitride semiconductor layer is grown on the at least one flat section of the upper face of the substrate;
    growing a second nitride semiconductor layer on the upper face of the first nitride semiconductor layer,
        wherein the second nitride semiconductor layer is made of $In_XAl_YGa_{1-X-Y}N$ ($0 \leq X$, $0 \leq Y$, $X+Y<1$);
        wherein, in an initial stage of growing the second nitride semiconductor layer, micronuclei are formed in multiple locations on the upper face of the first nitride semiconductor layer on the at least part of the first nitride semiconductor layer grown above the at least one flat section of the upper face of the substrate such that a plurality of upside-down hexagonal pyramid-shaped or upside-down hexagonal frustum-shaped recesses separate the micronuclei above the at least one flat section of the upper face of the substrate;
        wherein, after the initial stage of growing, further growth is performed;
        wherein the further growth is performed such that the second nitride semiconductor layer is grown to have at least one flat section of an upper face of the second nitride semiconductor layer at a height lower than an at least two upper ends of the at least two protrusions.

2. The method for producing a nitride semiconductor device according to claim 1 further forming a light emitting device structure stacking at least an n-type nitride semiconductor layer and a p-type nitride semiconductor layer on the second nitride semiconductor layer, and further forming an n-side electrode electrically connected to the n-type nitride semiconductor layer and a p-side electrode electrically connected to the p-type nitride semiconductor layer.

3. The method for producing a nitride semiconductor device according to claim 1, wherein the diameters of the recesses in a plan view at some time during the initial stage of growing the second nitride semiconductor layer are in a range of 100 nm to 200 nm.

* * * * *